US009877388B2

(12) United States Patent
Ogura et al.

(10) Patent No.: US 9,877,388 B2
(45) Date of Patent: Jan. 23, 2018

(54) TRANSMISSION MODULE AND CIRCUIT BOARD USED THEREIN

(71) Applicant: Hitachi Metals, Ltd., Tokyo (JP)

(72) Inventors: Akira Ogura, Hitachi (JP); Kinya Yamazaki, Hitachi (JP); Masataka Sato, Hitachi (JP); Shinji Komatsuzaki, Mito (JP)

(73) Assignee: HITACHI METALS, LTD., Tokyo (JP)

( * ) Notice: Subject to any disclaimer, the term of this patent is extended or adjusted under 35 U.S.C. 154(b) by 41 days.

(21) Appl. No.: 14/752,449

(22) Filed: Jun. 26, 2015

(65) Prior Publication Data
US 2016/0014891 A1 Jan. 14, 2016

(30) Foreign Application Priority Data

Jul. 14, 2014 (JP) .................. 2014-144154

(51) Int. Cl.
*H05K 7/00* (2006.01)
*H05K 1/11* (2006.01)
*H05K 1/02* (2006.01)

(52) U.S. Cl.
CPC .............. *H05K 1/11* (2013.01); *H05K 1/117* (2013.01); *H05K 1/0268* (2013.01); *H05K 1/0274* (2013.01); *H05K 2201/10189* (2013.01); *H05K 2201/10446* (2013.01)

(58) Field of Classification Search
CPC .................. H01L 21/565; G11C 5/06
USPC ........ 361/737–737, 760–764, 775–777, 803; 174/254–258
See application file for complete search history.

(56) References Cited

U.S. PATENT DOCUMENTS

| | | | | |
|---|---|---|---|---|
| 4,885,482 A * | 12/1989 | Sharp | ............ | G06F 13/387 326/47 |
| 6,002,173 A * | 12/1999 | Casati | ............ | H01L 23/4334 257/706 |
| 6,111,757 A * | 8/2000 | Dell | ............ | G11C 5/06 361/737 |
| 6,496,376 B1 * | 12/2002 | Plunkett | ............ | G06F 13/409 361/729 |
| 6,953,987 B2 * | 10/2005 | Numazaki | ............ | H01L 23/345 174/255 |
| 6,976,848 B2 * | 12/2005 | Choi | ............ | H05K 1/142 257/723 |

(Continued)

FOREIGN PATENT DOCUMENTS

JP 2007-303859 A 11/2007
JP 2013-171985 A 9/2013

*Primary Examiner* — Tuan T Dinh
(74) *Attorney, Agent, or Firm* — McGinn IP Law Group, PLLC.

(57) ABSTRACT

A transmission module includes an electrically insulative substrate body, a first card edge connector provided at a first end of the substrate body, a second card edge connector provided at a second end of the substrate body, a circuit element mounted on the substrate body, a control element mounted on the substrate body and provided with a built-in memory which controls the circuit element, a first wiring pattern formed on the substrate body for connecting an electrode of the first card edge connector and the control element together, and a second wiring pattern formed on the substrate body for connecting an electrode of the second card edge connector and the control element together.

12 Claims, 5 Drawing Sheets

(56) References Cited

U.S. PATENT DOCUMENTS

| | | | |
|---|---|---|---|
| 7,843,700 B2 * | 11/2010 | Fukuda | H01L 21/565 361/760 |
| 2004/0055783 A1 * | 3/2004 | Masuda | H01L 23/3107 174/252 |
| 2012/0310566 A1 * | 12/2012 | Hoshino | G01R 31/3651 702/63 |

* cited by examiner

TRANSMISSION MODULE AND CIRCUIT BOARD USED THEREIN

The present application is based on Japanese patent application No. 2014-144154 filed on Jul. 14, 2014, the entire contents of which are incorporated herein by reference.

BACKGROUND OF THE INVENTION

1. Field of the Invention

This invention relates to a transmission module with a circuit element and a control element mounted on a circuit board, and a circuit board used therein.

2. Description of the Related Art

In recent years, for a transmission module with a microprocessor having a built-in memory mounted on a circuit board, a firmware has been downloaded into the memory built in the microprocessor prior to factory shipment. The circuit board of the transmission module is provided with a pad for firmware downloading, separately from a card edge connector to be connected to a host, from the point of view of size reduction, cost reduction, etc. A probe is brought into contact with that pad, and the firmware is downloaded via this probe. Also, when the circuit board is mounted with an optical element, work such as alignment and adjustment to the amount of light is needed before factory shipment.

Also, there is a conventional transmission module, which, in order to perform unit verification as to whether or not a microprocessor with a built-in memory is operated as intended, measures voltage of a pad via a probe, compares the measured voltage and an intended voltage, and thereby verifies the operation of the microprocessor (Refer to e.g. JP-A-2007-303859).

Also, conventionally, a circuit board has been suggested that is provided with a card edge connector at opposite ends of a substrate body and that is mounted with electronic components thereon (Refer to e.g. JP-A-2013-171985).

SUMMARY OF THE INVENTION

However, the conventional transmission module has been unable to easily perform work, such as the downloading of the firmware and the verification of the operation of the microprocessor, due to requiring the probe for that work as its dedicated tool.

Accordingly, it is an object of the present invention to provide a transmission module, which is capable of easy work such as firmware downloading, verification with no dedicated tool required, and a circuit board to be used in that transmission module.

(1) According to a first embodiment of the invention, a transmission module comprises:

an electrically insulative substrate body;

a first card edge connector provided at a first end of the substrate body;

a second card edge connector provided at a second end of the substrate body;

a circuit element mounted on the substrate body;

a control element mounted on the substrate body and provided with a built-in memory configured to control the circuit element;

a first wiring pattern formed on the substrate body and configured to connect an electrode of the first card edge connector and the control element together; and a second wiring pattern formed on the substrate body and configured to connect an electrode of the second card edge connector and the control element together.

In the first embodiment, the following modifications and changes may be made.

(i) The transmission module further includes a third wiring pattern formed on the substrate body and configured to directly connect an electrode of the second card edge connector and the circuit element together.

(ii) The circuit element includes a light emitting element and a driving element configured to drive the light emitting element, or a light receiving element and an amplifying element configured to amplify an output signal of the light receiving element.

(iii) The substrate body is rectangular and is provided with the first and second card edge connectors at both ends opposite each other.

(iv) The first and second card edge connectors are configured to be connectable with the same receptacle connectors.

(2) According to a second embodiment of the invention, a transmission module comprises:

an electrically insulative substrate body;

a card edge connector provided at a first end of the substrate body;

a circuit element mounted on the substrate body;

a control element mounted on the substrate body and provided with a built-in memory configured to control the circuit element;

a first wiring pattern formed on the substrate body and configured to connect an electrode of the card edge connector and the control element together; and a second wiring pattern formed on the substrate body and extending from the control element to a second end of the substrate body.

In the second embodiment, the following modifications and changes may be made.

The transmission module further includes a third wiring pattern formed on the substrate body and extending from the circuit element to the second end of the substrate body.

(3) According to a third embodiment of the invention, a circuit board comprises:

an electrically insulative substrate body;

a first card edge connector provided at a first end of the substrate body;

a second card edge connector provided at a second end of the substrate body;

a circuit element mounting area provided on an upper or lower surface of the substrate body, the circuit element mounting area configured to be mounted with a circuit element thereon;

a control element mounting area provided on the upper or lower surface of the substrate body, the control element mounting area configured to be mounted with a control element thereon having a built-in memory configured to control the circuit element;

a first wiring pattern formed on the upper or lower surface of the substrate body and configured to connect an electrode of the first card edge connector and the control element mounting area together; and a second wiring pattern formed on the upper or lower surface of the substrate body and configured to connect an electrode of the second card edge connector and the control element mounting area together.

(Points of the Invention)

The present invention allows for easy work such as firmware downloading, verification, etc. with no dedicated tool required.

BRIEF DESCRIPTION OF THE DRAWINGS

The preferred embodiments according to the invention will be explained below referring to the drawings, wherein.

DETAILED DESCRIPTION OF THE PREFERRED EMBODIMENT

Next, an embodiment according to the invention will be explained in conjunction with the accompanying drawings. It should be noted that in these figures elements having substantially the same functions are given the same numerals respectively, and duplicated descriptions thereof are omitted.

(Embodiment)

Figure 1:
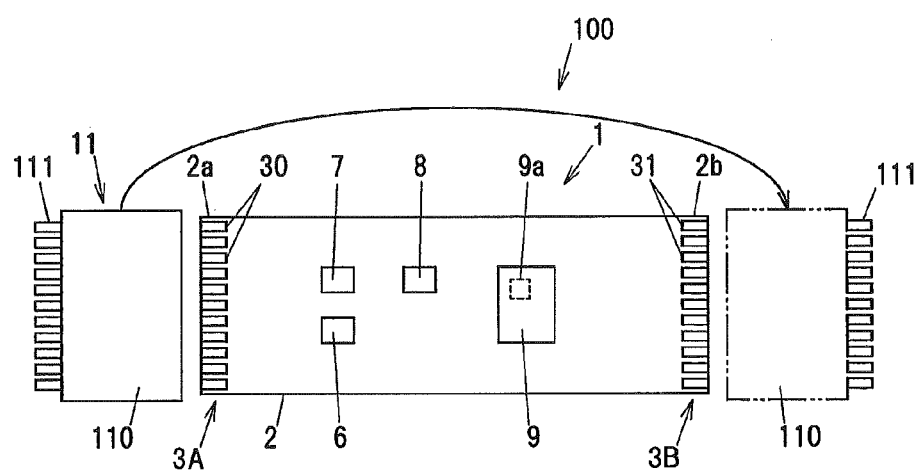
FIG. 1 is a plan view showing a schematic configuration example of a transmission module in an embodiment according to the invention.
Figure 2:
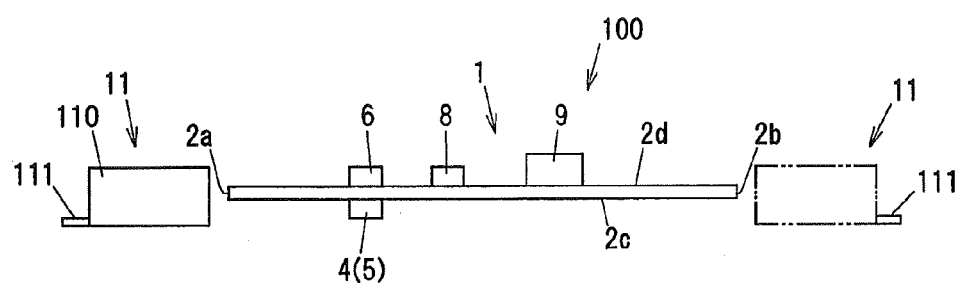
FIG. 2 is a front view showing the transmission module shown in FIG. 1.
Figure 3:
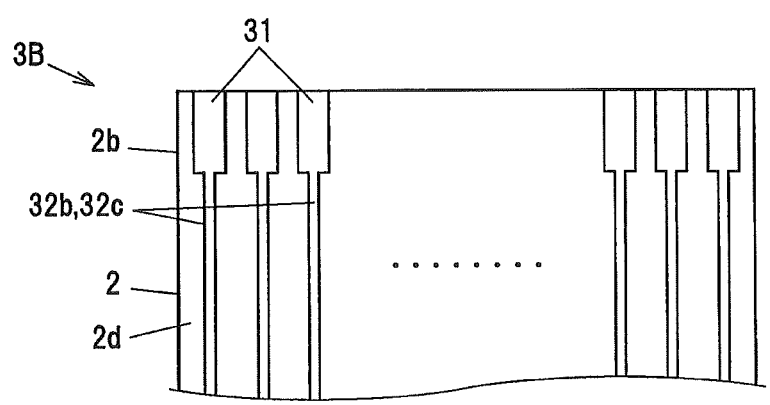
FIG. 3 is a plan view showing an essential portion of a second card edge connector and a periphery thereof.

FIG. 1 is a plan view showing a schematic configuration example of a transmission module in an embodiment according to the invention. FIG. 2 is a front view showing the transmission module shown in FIG. 1. FIG. 3 is a plan view showing an essential portion of a second card edge connector and a periphery thereof.

(Entire Configuration of the Transmission Module)

This transmission module 100 includes a circuit board 1, and the circuit board 1 is mounted with a light emitting element array 4 configured to output an optical signal, a light receiving element array 5 configured to receive an optical signal, a driver IC 6 configured to drive the light emitting element array 4, a preamplifier IC 7 configured to amplify an output signal of the light receiving element array 5, a switch 8 configured to switch a circuit, and a CPU (Central Processing Unit) 9 to control each circuit element on the circuit board 1. Here, the light emitting element array (optical element) 4, the light receiving element array (optical element) 5, the driver IC (driving element) 6, the preamplifier IC (amplifying element) 7, and the switch 8 are examples of the circuit elements. The CPU 9 is an example of a control element. Herein, the control element is used in the sense of excluding the circuit elements.

(Configuration of the Circuit Board)

As shown in FIG. 1, the circuit board 1 includes a generally rectangular electrically insulative substrate body 2, a first card edge connector 3A, which is provided at one end (a first end) 2a in a longitudinal direction of the substrate body 2, a second card edge connector 3B, which is provided at the other end (a second end) 2b in the longitudinal direction of the substrate body 2. The one end 2a and the other end 2b are opposite each other. It should be noted that the substrate body 2 may be a rigid or flexible substrate, or a multilayer substrate.

The substrate body 2 is formed of an electrically insulative material such as glass epoxy resin. The light emitting element array 4 and the light receiving element array 5 are mounted on each circuit element mounting areas, respectively, on a lower surface 2c of the substrate body 2. The driver IC 6, the preamplifier IC 7 and the switch 8 are mounted on each circuit element mounting areas, respectively, on an upper surface 2d of the substrate body 2. The CPU 9 is mounted on a control element mounting area of the upper surface 2d of the substrate body 2.

Also, in the lower surface 2c and the upper surface 2d of the substrate body 2 (or inside the substrate body 2 when the circuit board 1 is formed of a multilayer board), there are formed wiring patterns (see FIGS. 3 and 5) and through holes (not shown), which connect between electrodes 30 and 31, and the light emitting element array 4, the light receiving element array 5, the driver IC 6, the preamplifier IC 7 and the switch 8 (the circuit element mounting areas), and the CPU 9 (the control element mounting area).

(Configuration of the Card Edge Connector)

The first card edge connector 3A is configured in such a manner that a plurality of the electrodes 30 are formed on both surfaces, respectively, at one end 2a of the substrate body 2. The second card edge connector 3B is configured in such a manner that a plurality of the electrodes 31 are formed on both surfaces, respectively, at the other end 2b of the substrate body 2.

The first card edge connector 3A is configured to be connectable with a receptacle connector 11 to be connected with a host side, for example. The second card edge connector 3B is also configured to be connectable with a receptacle connector 11, which is the same as that connected to the host side. It should be noted that in FIGS. 1 and 2 the receptacle connectors 11 are shown as unconnected.

The receptacle connectors 11 each include a housing 110, which is formed of an electrically insulative resin, a plurality of internal terminals (not shown), which are provided within the housing 110, and which are connected to the electrodes 30 respectively of the first card edge connector 3A, or the electrodes 31 respectively of the second card edge connector 3B, and a plurality of external terminals 111, which are connected to the internal terminals respectively, and which are exposed from the housing 110. The plurality of external terminals 111 are connected with a cable (not shown).

The first card edge connector 3A, the second card edge connector 3B and the receptacle connectors 11 conform to a QSFP (Quad Small Form-factor Pluggable) standard as an optical transceiver standard corresponding to 40 GbE connection. That is, the receptacle connectors 11 are configured to be able to be connected to the first card edge connector 3A and the second card edge connector 3B. If the respective standards of the first card edge connector 3A at the one end 2a and the second card edge connector 3B at the other end 2b are the same, their standards are not limited to the QSFP standard, but may be another standard. Also, the first card edge connector 3A and the second card edge connector 3B may conform to different standards respectively. Even in this case, it is possible to perform work before factory shipment with no dedicated tool required.

The light emitting element array 4 includes a plurality (in the present embodiment four) of light emitting elements arrayed to transmit an optical signal. As the light emitting elements, there are listed, for example, a semiconductor laser element such as a VCSEL (vertical cavity surface emitting laser), an LED (Light Emitting Diode), etc. It should be noted that one light emitting element may be used in place of the light emitting element array 4.

The light receiving element array 5 includes a plurality of light receiving elements arrayed to receive an optical signal. As the light receiving element, there is a photodiode, for example. It should be noted that one light receiving element may be used in place of the light receiving element array 5.

The switch 8 is configured to be able to switch a circuit on the circuit board 1, depending on whether a chip resistor is mounted thereon or not, and set whether or not the first card edge connector 3A is enabled for firmware writing.

Figure 5:
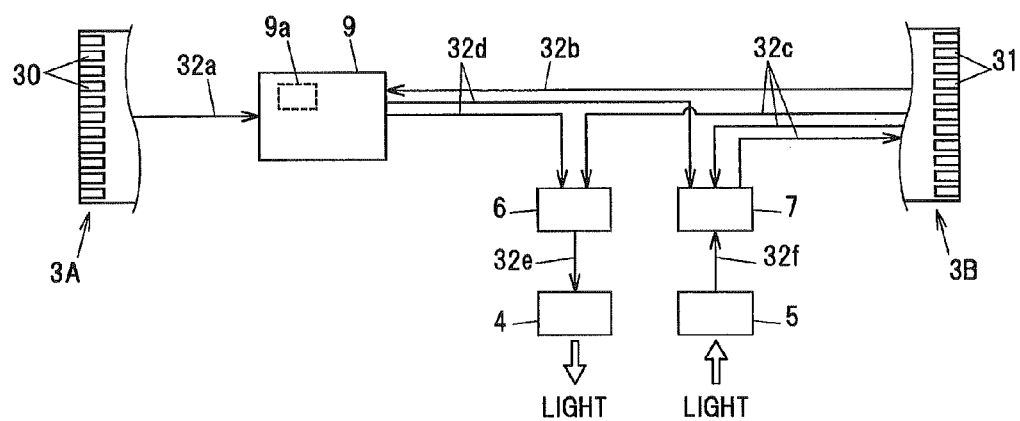
FIG. 5 is a schematic explanatory diagram showing work before factory shipment.

The CPU 9 has a built-in internal memory 9a, and is configured to store a firmware downloaded via the first card edge connector 3A or the second card edge connector 3B in that internal memory 9a. The CPU 9 performs control based on the firmware stored in that internal memory 9a. The CPU 9 interprets a command transmitted from a host via the first card edge connector 3A and a first wiring pattern 32a (FIG. 5), and transmits a control signal to the driver IC 6 and the preamplifier IC 7 via a fourth wiring pattern 32d (FIG. 5).

As shown in FIG. 3, the second card edge connector 3B and a periphery thereof is formed with the plurality of electrodes 31, and second and third wiring patterns 32b and 32c, etc. connected to each electrode 31 on the upper surface 2d at the end 2b of the substrate body 2. The electrodes 31 and the wiring patterns are formed on the lower surface 2c at the end 2b of the substrate body 2 as well, as with the upper surface 2d.

(Pin Array of the Second Card Edge Connector)

Figure 4:
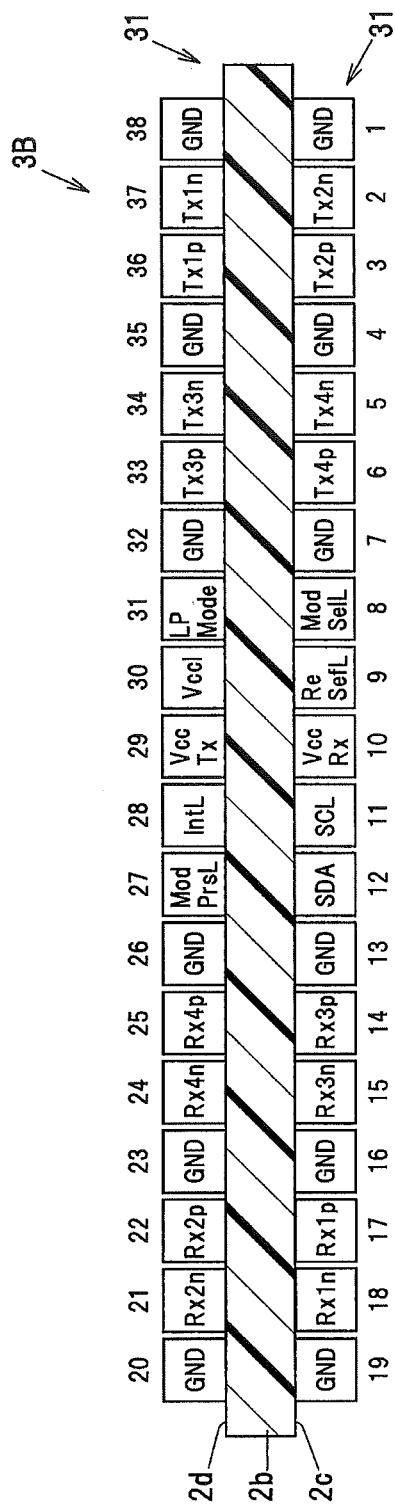
FIG. 4 is a diagram showing a pin array of the second card edge connector.

FIG. 4 is a diagram showing a pin array (an array of the electrodes 31) of the second card edge connector 3B. Pin number 8 (pin name ModSelL), pin number 9 (pin name ResetL), and pin number 31 (pin name LPMode) are provided for firmware downloading to the CPU 9.

Pin number 11 (pin name SCL), and pin number 12 (pin name SDA) are provided for control signal transmission to the driver IC 6 and the preamplifier IC 7. Pin number 28 (pin name intL) is provided for RSSI (Received Signal Strength Indicator) signal outputting from the preamplifier IC 7.

Pin number 14 (pin name Rx3p), pin number 15 (pin name Rx3n), pin number 17 (pin name Rx1p), pin number 18 (pin name Rx1n), pin number 21 (pin name Rx2n), pin number 22 (pin name Rx2p), pin number 24 (pin name Rx4n), and pin number 25 (pin name Rx4p) are provided for a signal of the preamplifier IC 7.

Also, pin number 2 (pin name Tx2n), pin number 3 (pin name Tx2p), pin number 5 (pin name Tx4n), pin number 6 (pin name Tx4p), pin number 33 (pin name Tx3p), pin number 34 (pin name Tx3n), pin number 36 (pin name Tx1p), and pin number 37 (pin name Tx1n) are provided for a signal of the driver IC 6.

Pin number 8 (pin name ModSelL), pin number 9 (pin name ReSetL), pin number 10 (pin name VccRx), pin number 11 (pin name SCL), pin number 12 (pin name SDA), pin number 27 (pin name ModPrsL), pin number 28 (pin name IntL), pin number 29 (pin name VccTx), pin number 30 (pin name Vcc1), and pin number 31 (pin name LPMode) are provided for a low-speed signal or power supply arranged in the middle of the second card edge connector 3B. An output signal from the preamplifier IC 7, and an input signal to the driver IC 6 are as high speed signals as 1 GHz or higher, and each are transmitted as a differential signal, and the corresponding pins (electrodes 31) are arranged apart from each other at both ends in the middle of the second card edge connector 3B, thereby suppressing a cross talk.

FIG. 5 is a schematic explanatory diagram showing work before factory shipment. The lower surface 2c or the upper surface 2d of the substrate body 2 is formed with a first wiring pattern 32a to connect the electrodes 30 of the first card edge connector 3A and the CPU 9, a second wiring pattern 32b to connect the electrodes 31 of the second card edge connector 3B and the CPU 9, a third wiring pattern 32c to connect the electrodes 31 of the second card edge connector 3B and the driver IC 6 and the preamplifier IC 7, a fourth wiring pattern 32d to connect the CPU 9 and the driver IC 6 and the preamplifier IC 7, a fifth wiring pattern 32e to connect the driver IC 6 and the light emitting element array 4, and a sixth wiring pattern 32f to connect the light receiving element array 5 and the preamplifier IC 7.

To perform work before factory shipment, the receptacle connector 11 is connected to the second card edge connector 3B (FIG. 1). A firmware is downloaded to the CPU 9 via the receptacle connector 11 and the electrodes 31 corresponding to the pin numbers 8, 9, and 31 of the second card edge connector 3B, and the second wiring pattern 32b. The firmware downloaded is stored in the internal memory 9a of the CPU 9. It should be noted that verification as to whether or not the CPU 9 is operated as intended according to the firmware downloaded may be performed via the second card edge connector 3B.

Then, a control signal is transmitted directly to the driver IC 6 and the preamplifier IC 7 via the receptacle connector 11 and the electrodes 31 corresponding to the pin number 11 (pin name SCL) and the pin number 12 (pin name SDA) of the second card edge connector 3B, and the third wiring pattern 32c.

The driver IC 6 drives the light emitting element array 4 based on the control signal, and causes the light emitting element array 4 to output an optical signal. For example, alignment between a light emitting element and an optical component such as a lens, an optical fiber, etc. and adjustment to the amount of light are performed while the amount of light of the optical signal is being observed using an external light receiver.

The preamplifier IC 7 outputs an RSSI signal as a reception strength signal via the third wiring pattern 32c, the electrode 31 corresponding to the pin number 28 of the second card edge connector 3B and the receptacle connector 11, based on the control signal. The RSSI signal has a voltage dependent on the amount of light received in the light receiving element array 5. For example, alignment between a light emitting element and an optical component such as a lens, an optical fiber, etc. and adjustment to the amount of light are performed while the voltage of the RSSI signal is being observed.

When the same work as that before factory shipment is performed after factory shipment, the receptacle connector 11 is connected to the first card edge connector 3A, and the switch 8 switches a circuit on the circuit board 1, depending on whether a chip resistor is mounted thereon or not, and enables the first card edge connector 3A for firmware writing. Thereafter, in the same manner as before factory shipment, firmware downloading, alignment, adjustment to the amount of light are performed.

Figure 6:
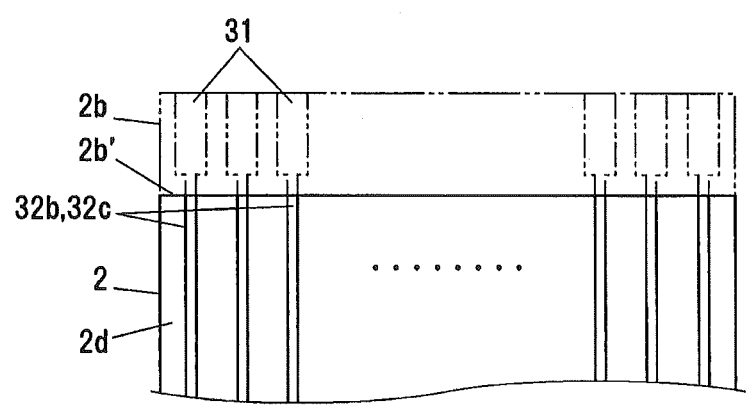
FIG. 6 is a plan view showing an essential portion of a substrate body cut at its second card edge connector side end after adjustment before factory shipment has been finished.

FIG. 6 is a plan view showing an essential portion of the substrate body 2 cut at its second card edge connector 3B side end 2b after the work before factory shipment has been finished. After the work has been finished before factory shipment, the second card edge connector 3B is not needed, and the second card edge connector 3B may therefore be cut and separated from the substrate body 2, as shown in FIG. 6. By doing so, size reduction of the circuit board 1 is ensured. The end 2b' of the substrate body 2 from which the second card edge connector 3B is separated becomes the second end.

(Operation and Advantageous Effects of the Present Invention)

The present embodiment has the following operation and advantageous effects.

(1) Since the receptacle connector 11 for the first card edge connector 3A can be connected to the second card edge connector 4B, it is possible to, with no such a dedicated tool as a probe required, easily perform firmware downloading, alignment, adjustment to the amount of light, verification, etc., prior to factory shipment.

(2) Since the switch 8 is provided on the circuit board 1, it is possible to perform firmware downloading from the first card edge connector 3A.

It should be noted that the invention is not limited to the above described embodiment, but various alterations may be made. For example, although in the above described embodiment the first card edge connector 3A and the second card edge connector 3B are located at the ends opposite each other of the substrate body 2, the first card edge connector 3A and the second card edge connector 3B may be provided at the same end of the substrate body 2, or at ends in directions crossing each other.

Also, although in the above described embodiment the optical elements and the driver IC and the preamplifier IC for the optical elements are mounted on the circuit board, other circuit elements may be mounted on the circuit board without mounting these circuit elements.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A transmission module, comprising:
   an electrically insulative substrate body;
   a first card edge connector provided at a first end of the substrate body, and including first electrodes;
   a second card edge connector provided at a second end of the substrate body, and including second electrodes;
   a circuit element mounted on the substrate body:
   a control element mounted on the substrate body and provided with a built-in memory that controls the circuit dement;
   a first wiring pattern formed on the substrate body and connects the first electrodes of the first card edge connector and the control element together; and
   a second wiring pattern formed on the substrate body and connects the second electrodes of the second card edge connector and the control dement together;
   wherein the first electrodes electrode of the first card edge connector include a third electrode for firmware downloading and the first wiring pattern includes a third wiring pattern connecting the third electrode and the control element, and
   wherein the second electrodes of the second card edge connector include a fourth electrode for firmware downloading and the second wiring pattern includes a fourth wiring pattern connecting the fourth electrode and the control element, and
   the circuit board further comprising: a switch which switches the third wiring pattern to achieve a connected state or a non-connected state between the third electrode and the control element.

2. The transmission module according to claim 1, wherein the circuit element includes a light emitting element and a driving element that drives the light emitting element, or a light receiving element and an amplifying element that amplifies an output signal of the light receiving element.

3. The transmission module according to claim 1, wherein the substrate body is rectangular and is provided with the first and second card edge connectors at both ends opposite each other.

4. The transmission module according to claim 1, wherein the first and second card edge connectors are connectable with receptacle connectors conforming to a same standard.

5. The transmission module according to claim 1, wherein the control element stores the firmware downloaded via the first card edge connector or the second card edge connector.

6. The transmission module according to claim 1, wherein the switch further function in which switches a circuit on a circuit board of the transmission module to enable the first card edge connector for firmware writing.

7. The transmission module according to claim 4, wherein the first card edge connector, the second card edge connector, and the receptacle connectors conform to the same standard.

8. A circuit board, comprising:
   an electrically insulative substrate body;
   a first card edge connector provided at a first end of the substrate body, and including first electrodes;
   a second card edge connector provided at a second end of the substrate body, and including second electrodes an electrode;
   a circuit element mounting area provided on an upper surface or a lower surface of the substrate body, the circuit element mounting area being mounted with a circuit element thereon;
   a control element mounting area provided on the upper surface or the lower surface of the substrate body, the control element mounting area being mounted with a control element thereon including a built-in memory that to controls the circuit element;
   a first wiring pattern formed on the upper surface or the lower surface of the substrate body and connects the first electrodes of the first card edge connector and the control element mounting area together; and
   a second wiring pattern formed on the upper surface or the lower surface of the substrate body and connects the second electrodes of the second card edge connector and the control element mounting area together,
   wherein the first electrodes of the first card edge connector include a third electrode for firmware downloading and the first wiring pattern includes a third wiring pattern connecting the third electrode and the control element,
   wherein the second electrodes of the second card edge connector include a fourth electrode for firmware downloading and the second wiring pattern includes a fourth wiring pattern connecting the fourth electrode and the control element, and
   the circuit board further comprising: a switch which switches the third wiring pattern to achieve a connected state or a non-connected state between the third electrode and the control element.

9. The circuit board according to claim 8, wherein the first and second card edge connectors are connected with receptacle connectors conforming to a same standard.

10. The circuit board according to claim 8, wherein the control element stores the firmware downloaded via the first card edge connector or the second card edge connector.

11. The circuit board according to claim 8, wherein the switch further function in a circuit on the circuit board to enable the first card edge connector for firmware writing.

12. The circuit board according to claim 9, wherein the first card edge connector, the second card edge connector, and the receptacle connectors conform to the same standard.

* * * * *